(12) United States Patent
Li et al.

(10) Patent No.: US 12,402,456 B2
(45) Date of Patent: Aug. 26, 2025

(54) DISPLAY SUBSTRATE AND METHOD FOR MANUFACTURING THE SAME, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Jian Li, Beijing (CN); Chenchang Chen, Beijing (CN); Shipeng Wang, Beijing (CN); Pei Li, Beijing (CN); Pengjun Cao, Beijing (CN); Jinpeng Li, Beijing (CN); Zhiyuan Wang, Beijing (CN); Teng Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 671 days.

(21) Appl. No.: 17/618,031

(22) PCT Filed: Feb. 26, 2021

(86) PCT No.: PCT/CN2021/078256
§ 371 (c)(1),
(2) Date: Dec. 10, 2021

(87) PCT Pub. No.: WO2021/190245
PCT Pub. Date: Sep. 30, 2021

(65) Prior Publication Data
US 2022/0262995 A1    Aug. 18, 2022

(30) Foreign Application Priority Data
Mar. 27, 2020 (CN) .......................... 202010232324.3

(51) Int. Cl.
*H10H 20/856* (2025.01)
*H01L 25/16* (2023.01)
*H10H 20/01* (2025.01)

(52) U.S. Cl.
CPC ......... *H10H 20/856* (2025.01); *H01L 25/167* (2013.01); *H10H 20/0363* (2025.01)

(58) Field of Classification Search
CPC ........... H01L 25/0753; H01L 33/58–60; H01L 2933/0058; H01L 33/54;
(Continued)

(56) References Cited

U.S. PATENT DOCUMENTS 6,100,545 A * 8/2000 Chiyo ................. H01L 33/0075
257/E33.068
2005/0148105 A1* 7/2005 Suehiro ................ C08G 18/025
438/22
(Continued)

FOREIGN PATENT DOCUMENTS

| CN | 102299245 A | 12/2011 |
|---|---|---|
| CN | 103594463 A | 2/2014 |

(Continued)

OTHER PUBLICATIONS

Extended European Search Report for corresponding European Application No. 21775135.3, dated Aug. 31, 2023, 11 pages.
(Continued)

*Primary Examiner* — Amar Movva
(74) *Attorney, Agent, or Firm* — Dority & Manning, P.A.

(57) ABSTRACT

A display substrate includes a first base, a plurality of light-emitting devices disposed on a side of the first base, a light dimming layer located in gaps between the plurality of light-emitting devices and located on surfaces of the plurality of light-emitting devices away from the first base, and a second base covering the light dimming layer. The plurality
(Continued)

of light-emitting devices are spaced apart from each other. At least one light-emitting device is surrounded by the light dimming layer, a material of a portion, located in the gaps between the plurality of light-emitting devices, of the light dimming layer includes a light absorbing material, and the light dimming layer is configured to absorb part of light entering the light dimming layer.

19 Claims, 9 Drawing Sheets

(58) Field of Classification Search
CPC .......... H10H 20/855–856; H10H 29/855–856; H10H 20/0363; H10H 29/0363; H10H 20/853; H10H 29/853
See application file for complete search history.

(56) References Cited

U.S. PATENT DOCUMENTS

| | | | |
|---|---|---|---|
| 2005/0214963 A1 | 9/2005 | Daniels et al. | |
| 2011/0012149 A1 | 1/2011 | Basin et al. | |
| 2011/0309398 A1* | 12/2011 | Ito | H01L 33/505 |
| | | | 257/E33.061 |
| 2013/0187174 A1 | 7/2013 | Tischler | |
| 2017/0133550 A1 | 5/2017 | Schuele et al. | |
| 2017/0322354 A1* | 11/2017 | Choi | G02B 5/208 |
| 2018/0102348 A1* | 4/2018 | Haiberger | H01L 33/54 |
| 2019/0115329 A1 | 4/2019 | Min et al. | |
| 2019/0157523 A1 | 5/2019 | Hong | |
| 2019/0305197 A1 | 10/2019 | Yamada | |
| 2020/0067009 A1 | 2/2020 | Wu et al. | |
| 2020/0083397 A1* | 3/2020 | Lee | H01L 33/56 |
| 2020/0152612 A1 | 5/2020 | Chen et al. | |

FOREIGN PATENT DOCUMENTS

| | | |
|---|---|---|
| CN | 106384738 | 2/2017 |
| CN | 211879404 | 11/2020 |
| JP | 2005203737 A | 7/2005 |
| JP | 2007035798 A | 2/2007 |
| JP | 2007300134 A | 11/2007 |
| JP | 2007531321 A | 11/2007 |
| JP | 2008041968 A | 2/2008 |
| JP | 2012009469 A | 1/2012 |
| JP | 2019204905 A | 11/2019 |
| KR | 20190077789 | 7/2019 |
| KR | 20200029191 A | 3/2020 |
| TW | 201025676 | 7/2010 |
| WO | WO2019220267 A1 | 11/2019 |

OTHER PUBLICATIONS

International Search Report (w/ English translation) for corresponding PCT Application No. PCT/CN2021/078256, mailed May 19, 2021, 5 pages.
Chinese Office Action (w/ English translation) for corresponding CN Application No. 109145944, 22 pages.
Chinese Office Action (w/ English translation) for corresponding CN Application No. 202010232324.3, dated Sep. 20, 2024, 19 pages.
Japanese Office Action (w/ English translation) for corresponding JP Application No. 2022-502266, dated Jan. 7, 2025, 21 pages.
Korean Office Action (w/ English translation) for corresponding KR Application No. 10-2022-7002123, dated Dec. 11, 2024, 12 pages.

* cited by examiner

DISPLAY SUBSTRATE AND METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/078256, filed on Feb. 26, 2021, which claims priority to Chinese Patent Application No. 202010232324.3, filed on Mar. 27, 2020, which are incorporated herein by reference in their entirety.

TECHNICAL FIELD

The present disclosure relates to the field of display technologies, and in particular, to a display substrate and a method for manufacturing the same, and a display apparatus.

BACKGROUND

Mini light-emitting diodes (mini LEDs) and micro light-emitting diodes (micro LEDs) have been applied to the fields of micro displays, medium-sized displays such as mobile phones and televisions, and large-sized displays such as screens in cinemas due to their advantages of self-luminescence, high efficiency, high brightness, high reliability, energy saving and fast response speed.

SUMMARY

In one aspect, a display substrate is provided. The display substrate includes: a first base, a plurality of light-emitting devices, a light dimming layer and a second base. The plurality of light-emitting devices are disposed on a side of the first base, and the plurality of light-emitting devices are spaced apart from each other. The light dimming layer is located in gaps between the plurality of light-emitting devices and located on surfaces of the plurality of light-emitting devices away from the first base; at least one light-emitting device is surrounded by the light dimming layer; a material of a portion, located in the gaps between the plurality of light-emitting devices, of the light dimming layer includes a light absorbing material; and the light dimming layer is configured to absorb part of light entering the light dimming layer. The second base covers the light dimming layer.

In some embodiments, the light dimming layer includes: a first light dimming sub-layer and a second light dimming sub-layer. The first light dimming sub-layer is located in the gaps between the plurality of light-emitting devices. Relative to a surface, on which the plurality of light-emitting devices are arranged, of the first base, a surface of the first light dimming sub-layer away from the first base is flush with the surfaces of the plurality of light-emitting devices away from the first base, or the surface of the first light dimming sub-layer away from the first base is higher or lower than the surfaces of the plurality of light-emitting devices away from the first base; a material of the first light dimming sub-layer includes the light absorbing material, and the first light dimming sub-layer is configured to absorb at least part of light entering the first light dimming sub-layer. The second light dimming sub-layer is disposed on a side of the first light dimming sub-layer away from the first base and disposed on the surfaces of the plurality of light-emitting devices away from the first base. Relative to the surface of the first base, a surface of the second light dimming sub-layer away from the first base is higher than the surfaces of the plurality of light-emitting devices away from the first base; and the second light dimming sub-layer is a transparent film.

In some embodiments, in a case where relative to the surface of the first base, the surface of the first light dimming sub-layer away from the first base is lower than the surfaces of the plurality of light-emitting devices away from the first base, the second light dimming sub-layer includes first portions and a second portion; orthogonal projections of the first portions on the first base coincide with orthogonal projections of the plurality of light-emitting devices on the first base, and an orthogonal projection of the second portion on the first base coincides with an orthogonal projection of the first light dimming sub-layer on the first base; and a thickness of the first portions is in a range from 20 μm to 100 μm, and a thickness of the second portion is in a range from 50 μm to 100 μm.

In some embodiments, a refractive index of the second light dimming sub-layer is greater than a refractive index of the second base.

In some embodiments, a distance between the surface of the first base and the surface of the first light dimming sub-layer away from the first base is in a range from 80% to 120% of a thickness of the plurality of light-emitting devices.

In some embodiments, the light dimming layer further includes a third light dimming sub-layer located in the gaps between the plurality of light-emitting devices and disposed between the first light dimming sub-layer and the first base. Relative to the surface of the first base, a surface of the third light dimming sub-layer away from the first base is flush with or lower than the surfaces of the plurality of light-emitting devices away from the first base. A material of the third light dimming sub-layer includes a light reflecting material, and the third light dimming sub-layer is configured to reflect light incident from the plurality of light-emitting devices onto the third light dimming sub-layer back into the plurality of light-emitting devices.

In some embodiments, the light dimming layer includes: a first light dimming sub-layer and a third light dimming sub-layer. The third light dimming sub-layer is located in the gaps between the plurality of light-emitting devices. Relative to a surface, on which the plurality of light-emitting devices are arranged, of the first base, a surface of the third light dimming sub-layer away from the first base is flush with or lower than the surfaces of the plurality of light-emitting devices away from the first base; a material of the third light dimming sub-layer includes a light reflecting material, and the third light dimming sub-layer is configured to reflect light incident from the plurality of light-emitting devices onto the third light dimming sub-layer back into the plurality of light-emitting devices. The first light dimming sub-layer is disposed on a side of the third light dimming sub-layer away from the first base and disposed on the surfaces of the plurality of light-emitting devices away from the first base. Relative to the surface of the first base, a surface of the first light dimming sub-layer away from the first base is higher than the surfaces of the plurality of light-emitting devices away from the first base; a material of the first light dimming sub-layer includes the light absorbing material, and the first light dimming sub-layer is configured to absorb at least part of light entering the first light dimming sub-layer.

In some embodiments, a reflectivity of the third light dimming sub-layer is greater than or equal to 70%.

In some embodiments, each light-emitting device includes a third base, and a light-emitting layer disposed on a side of the third base. The light-emitting layer is closer to the first base than the third base.

In some embodiments, a refractive index of the third base is greater than a refractive index of the second light dimming sub-layer, and the refractive index of the second light dimming sub-layer is greater than a refractive index of the second base.

In some embodiments, the light dimming layer further includes a third light dimming sub-layer located in the gaps between the plurality of light-emitting devices and disposed between the first light dimming sub-layer and the first base, a material of the third light dimming sub-layer includes a light reflecting material, and the third light dimming sub-layer is configured to reflect light incident from the plurality of light-emitting devices onto the third light dimming sub-layer back into the plurality of light-emitting devices; and relative to the surface of the first base, a surface of the third light dimming sub-layer away from the first base is higher than the surfaces of the plurality of light-emitting devices away from the first base.

In some embodiments, in a case where the light dimming layer includes the first light dimming sub-layer, the material of the first light dimming sub-layer includes acrylic adhesive doped with the light absorbing material. In a case where the light dimming layer includes the second light dimming sub-layer, a material of the second light dimming sub-layer includes acrylic adhesive. In a case where the light dimming layer includes a third light dimming sub-layer, a material of the third light dimming sub-layer includes acrylic adhesive doped with a light reflecting material.

In some embodiments, the display substrate further includes a plurality of microstructures disposed on a surface of the second base away from the first base. The plurality of microstructures are configured to change propagation directions of at least part of light coming from the plurality of light-emitting devices and passing through the second base.

In some embodiments, shapes of surfaces of the plurality of microstructures that are not in contact with the second base include at least one of a pyramid, a wedge, a curved shape or a spherical shape.

In another aspect, a method for manufacturing a display substrate is provided. The method includes: providing a first base; providing a plurality of light-emitting devices spaced apart from each other on a surface of the first base; providing a second base; forming a light dimming layer on a surface of the second base; and pressing the first base on which the plurality of light-emitting devices have been formed and the second base on which the light dimming layer has been formed together by using a pressing process, so that the plurality of light-emitting devices are embedded into the light dimming layer, a portion of the light dimming layer is located in gaps between the plurality of light-emitting devices, and other portions of the light dimming layer are located on surfaces of the plurality of light-emitting devices away from the first base. A material of the portion, located in the gaps between the plurality of light-emitting devices, of the light dimming layer includes a light absorbing material.

In some embodiments, the pressing process includes a vacuum pressing process or a rolling process.

In yet another aspect, a display apparatus is provided. The display apparatus includes the display substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, and actual processes of methods involved in the embodiments of the present disclosure.

DETAILED DESCRIPTION

Figure 1:
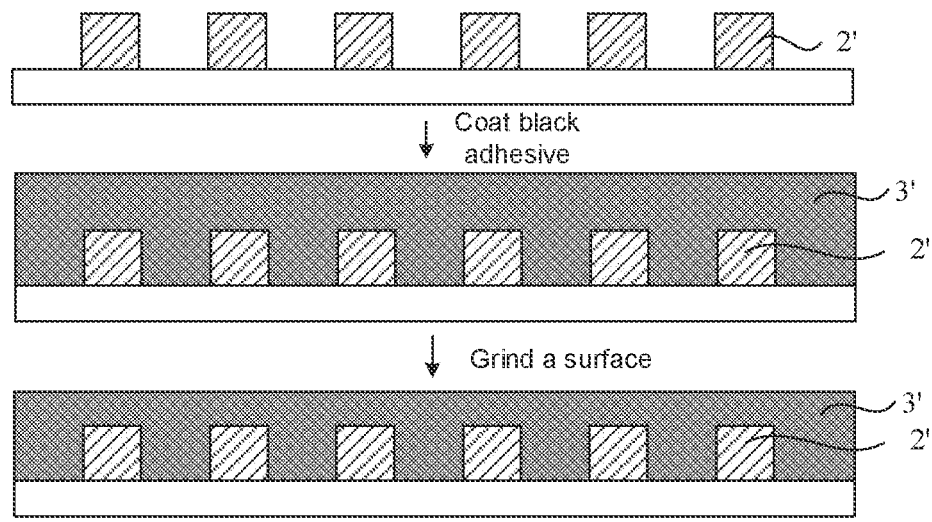
FIG. 1 is a diagram of a method for manufacturing a display substrate in the related art.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its derivatives may be used. For example, the term "connected" may be used in the description of some embodiments to indicate that two or more components are in direct physical contact or electrical contact with each other.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "configured to" herein means an open and inclusive expression, which does not exclude devices that are configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, terms such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

In the related art, mini LEDs or micro LEDs are capable of emitting light of various colors, such as red, green, blue or yellow. The mini LEDs or the micro LEDs may be applied as light-emitting devices to a display substrate for display.

As shown in FIG. 1, a display substrate to which a plurality of mini LEDs 2' are applied is taken as an example. In the related art, black adhesive 3' is generally coated in gaps between the plurality of mini LEDs 2' and on surfaces of the plurality of mini LEDs 2', and the black adhesive 3' is ground by using a grinding process, so that a thickness of a portion of the black adhesive 3' located on the surfaces of the mini LEDs 2' is a desired thickness. In this way, a contrast of a display apparatus may be improved by utilizing the ground black adhesive 3'. Here, due to limitation of the grinding process, the portion of the black adhesive 3' on the surfaces of the mini LEDs 2' may be only ground to a thickness of a range from 40 μm to 50 μm at present.

If the thickness of the portion of the black adhesive 3' located on the surfaces of the mini LEDs 2' is greater than a thickness of the mini LEDs 2', in a case where a display brightness of the display substrate in which the black adhesive is provided is the same as a display brightness of a display substrate in which the black adhesive is not provided, a large driving voltage needs to be provided to the display substrate in which the black adhesive is provided, which will increase power consumption of the display substrate. In addition, in a case where the black adhesive is made of silica gel doped with black particles, the black particles may detach from the silica gel in a process of grinding the black adhesive, resulting in unevenness of a surface of the ground black adhesive, further affecting an appearance of the display substrate.

Figure 2:
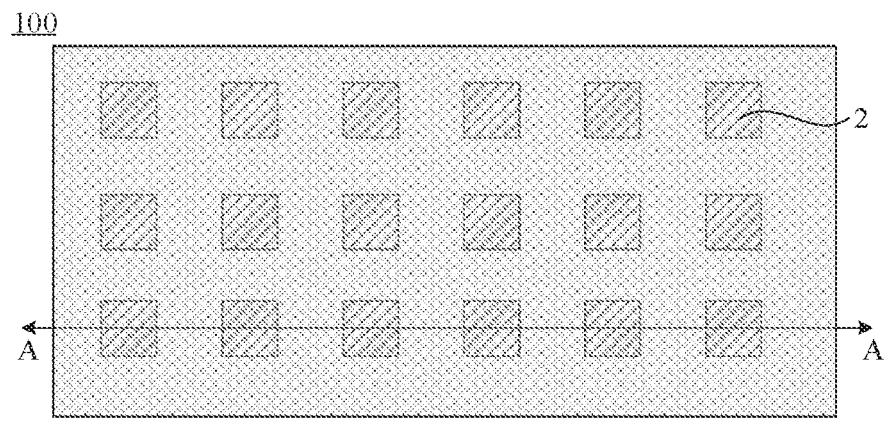
FIG. 2 is a top view of a display substrate, in accordance with some embodiments of the present disclosure.
Figure 3:
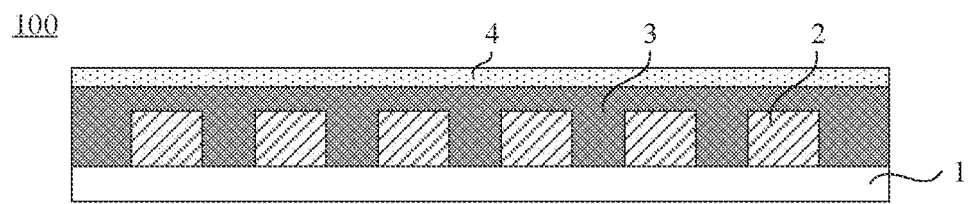
FIG. 3 is a sectional view of the display substrate in FIG. 2 taken along the A-A' line.

As shown in FIG. 2, some embodiments of the present disclosure provide a display substrate 100. As shown in FIGS. 3 to 9, the display substrate 100 includes a first base 1, a plurality of light-emitting devices 2 disposed on a side of the first base 1, a light dimming layer 3 and a second base 4.

Figure 13:
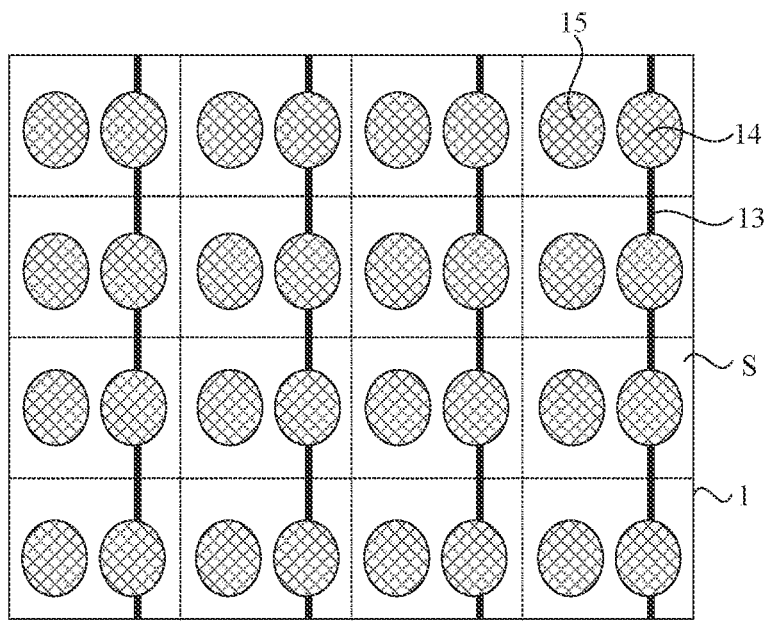
FIG. 13 is a partial structural diagram of a display substrate, in accordance with some embodiments of the present disclosure.
Figure 14:
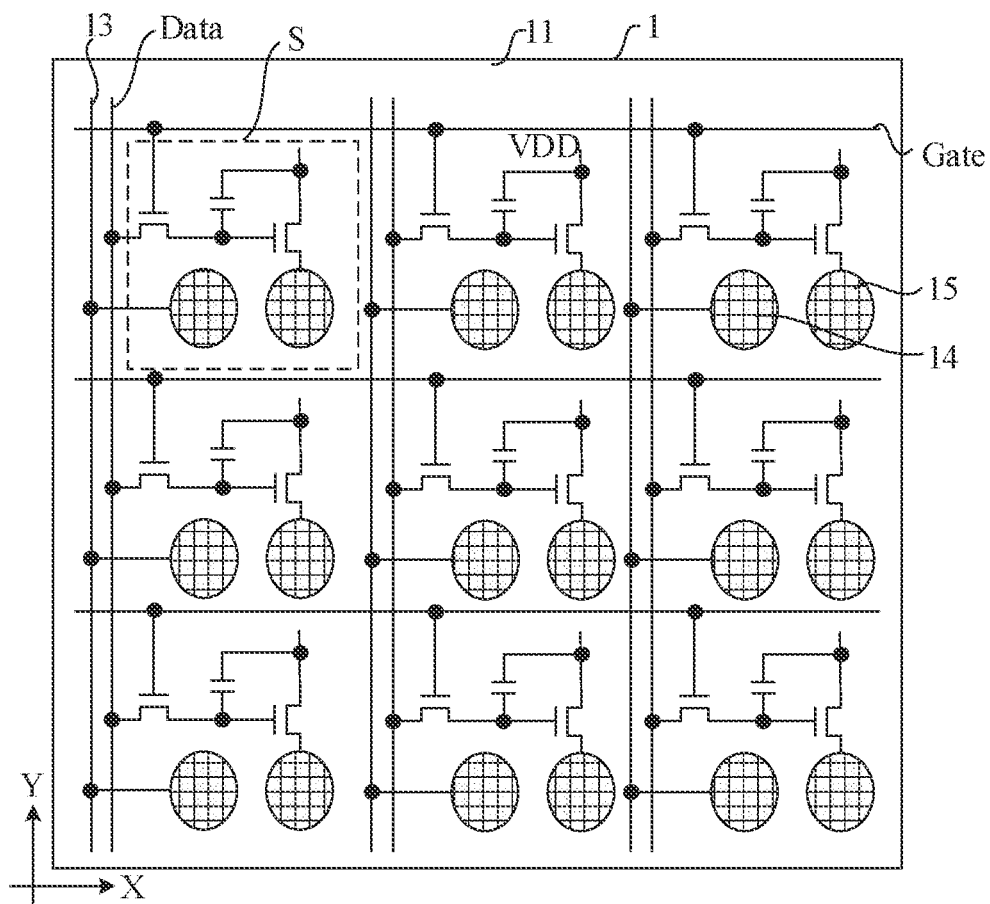
FIG. 14 is a partial structural diagram of another display substrate, in accordance with some embodiments of the present disclosure.

In some examples, as shown in FIGS. 13 and 14, the display substrate 100 has a plurality of sub-pixel regions S arranged in an array.

The plurality of light-emitting devices 2 can be arranged in various manners. For example, each sub-pixel region S is provided with one light-emitting device 2 therein. In this case, the light-emitting device 2 is used for display of a sub-pixel in the sub-pixel region S. For another example, each sub-pixel region S is provided with light-emitting devices 2 therein, which are used for display of a sub-pixel together.

Hereinafter, embodiments of the present disclosure will schematically illustrate structures of the display substrate 100 by taking an example in which each sub-pixel region S is provided with one light-emitting device 2 therein.

Figure 12:
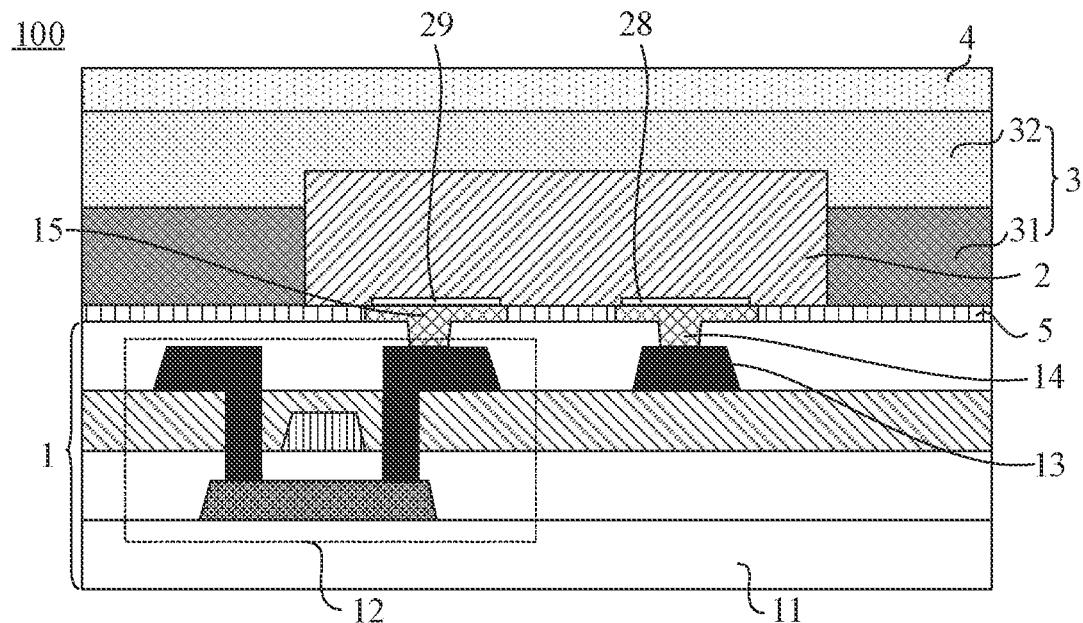
FIG. 12 is a structural diagram of a display substrate, in accordance with some embodiments of the present disclosure.

In some examples, as shown in FIGS. 12 and 14, the first base 1 includes a base substrate 11, a plurality of pixel driving circuits, a plurality of gate lines Gate, a plurality of data lines Data, a plurality of electrode leads 13, and a plurality of pads. The plurality of pads include anode pads 15 and cathode pads 14. The plurality of gate lines Gate may extend in a first direction X, and the plurality of data lines Data may extend in a second direction Y; and the first direction X and the second direction Y cross each other.

Here, a type of the base substrate 11 may be various.

For example, the base substrate 11 may be a rigid base substrate, such as a glass base substrate or a polymethyl methacrylate (PMMA) base substrate. In a case where the base substrate 11 adopts the glass base substrate, it is beneficial to improve accuracy of wirings (e.g., the plurality of pixel driving circuits and the plurality of electrode leads 13) provided on a side of the base substrate 11.

For example, the base substrate 11 may be a flexible base substrate, such as a polyethylene terephthalate (PET) base substrate, a polyethylene naphthalate (PEN) base substrate, or a polyimide (PI) base substrate.

An arrangement of the plurality of pixel driving circuits is related to the arrangement of the light-emitting devices 2. For example, the plurality of pixel driving circuits are disposed on the side of the base substrate 11; and in the case where one light-emitting device 2 is provided in each sub-pixel region S, each sub-pixel region S is provided with one pixel driving circuit therein. Pixel driving circuits arranged in a line in the first direction X may be electrically connected to one gate line Gate, and pixel driving circuits arranged in a line in the second direction Y may be electrically connected to one data line Data.

Here, a structure of the pixel driving circuit may be various. For example, the structure of the pixel driving circuit may be a structure of "2T1C", "6T1C", "7T1C", "6T2C", "7T2C" or the like. Here, "T" represents a thin film transistor, and the number before "T" represents the number of thin film transistors; "C" represents a storage capacitor, and the number before "C" represents the number of storage capacitors. One of a plurality of thin film transistors included in the pixel driving circuit of each structure is a driving transistor.

The plurality of electrode leads 13 and the plurality of pixel driving circuits are located on the same side of the base substrate 11. An arrangement of the plurality of electrode leads 13 is related to the arrangement of the light-emitting devices 2.

For example, each electrode lead 13 may be disposed in a row of sub-pixel regions S, and an extension direction of the electrode lead 13 may be parallel (or approximately parallel) to an direction (i.e., the first direction X) in which the row of sub-pixel regions S are arranged. Alternatively, as shown in FIG. 13, each electrode lead 13 may be disposed in a column of sub-pixel regions S, and an extension direction of the electrode lead 13 may be parallel (or approximately parallel) to an direction (i.e., the second direction Y) in which the column of sub-pixel regions S are arranged. The number of electrode leads 13 disposed in each row of sub-pixel regions S or each column of sub-pixel regions S is the same as the number of light-emitting device(s) 2 disposed in each sub-pixel region S in the row of sub-pixel regions S or the column of sub-pixel regions S.

As shown in FIG. 12, the plurality of pads are disposed on a side of the plurality of pixel driving circuits and the plurality of electrode leads 13 away from the base substrate 11.

An arrangement of the plurality of pads is related to the arrangement and structure of the light-emitting devices 2.

For example, each light-emitting device 2 may be a mini LED or a micro LED, and the mini LED or the micro LED has two electrode pins (e.g., a cathode electrode pin and an anode electrode pin). In this case, as shown in FIGS. 13 and 14, a cathode pad 14 and an anode pad 15 may be disposed in each sub-pixel region S. In the same sub-pixel region S, the anode pad 15 may be electrically connected to the pixel driving circuit (e.g., to the driving transistor 12 shown in FIG. 12), and the cathode pad 14 may be electrically connected to the electrode lead 13. In this way, the cathode electrode pin of the light-emitting device 2 may be in contact with the cathode pad 14 in the same sub-pixel region S, and the anode electrode pin of the light-emitting device 2 may be in contact with the anode pad 15 in the same sub-pixel region S, so as to achieve electrical connection between the light-emitting device 2 and the pixel driving circuit and between the light-emitting device 2 and the electrode lead 13.

The pixel driving circuit is configured to provide a driving voltage for the light-emitting device 2; and the electrode lead 13 is configured to provide a common voltage for the light-emitting device 2. In this way, due to the cooperation of the pixel driving circuit and the electrode lead 13, a light-emitting state of the light-emitting device 2 may be controlled, so that a grayscale display of the display substrate 100 is achieved.

Of course, in addition to the above manner for driving the plurality of light-emitting devices 2, other manners may be used in embodiments of the present disclosure. For example, the plurality of light-emitting devices 2 may be driven in a passive driving manner or an integrated circuit (IC) driving manner in the embodiments of the present disclosure.

Figure 15:
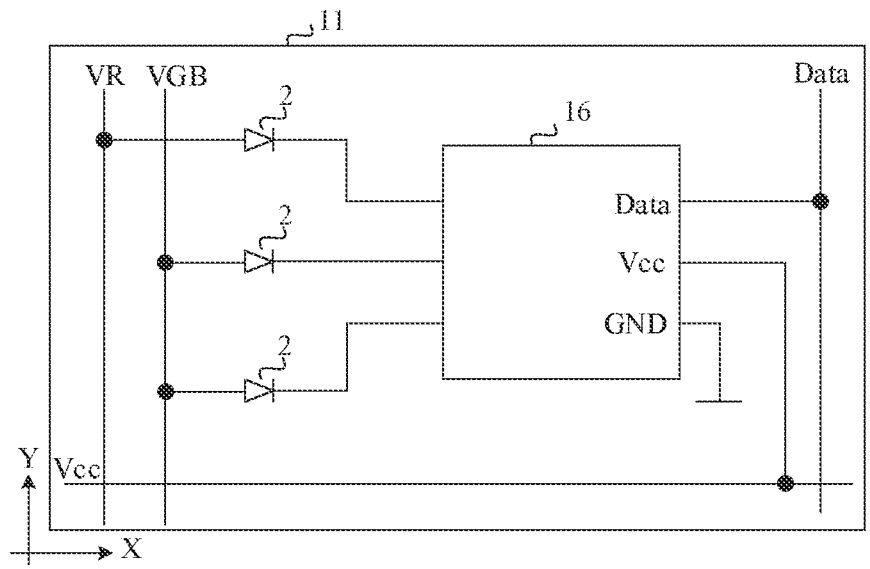
FIG. 15 is a partial structural diagram of yet another display substrate, in accordance with some embodiments of the present disclosure.

For example, as shown in FIG. 15, the first base 1 may include a base substrate 11, a plurality of integrated circuits 16, a plurality of power supply voltage signal lines $V_{CC}$, a plurality of first voltage signal lines VR, a plurality of second voltage signal lines VGB and a plurality of data lines Data. The plurality of power supply voltage signal lines $V_{CC}$ may extend in the first direction X, and the plurality of first voltage signal lines VR, the plurality of second voltage signal lines VGB and the plurality of data lines Data may extend in the second direction Y.

An integrated circuit 16 may be electrically connected to at least one light-emitting device 2. For example, as shown in FIG. 15, the integrated circuit 16 may be electrically connected to three light-emitting devices 2. The three light-emitting devices 2 include, for example, a light-emitting device for emitting red light, a light-emitting device for emitting green light and a light-emitting device for emitting blue light.

In this case, an anode electrode pin of each light-emitting device for emitting red light may be electrically connected to a first voltage signal line VR through an anode pad, an anode electrode pin of each light-emitting device for emitting green light may be electrically connected to a second voltage signal line VGB through another anode pad, and an anode electrode pin of each light-emitting device for emitting blue light may be electrically connected to the second voltage signal line VGB through yet another anode pad.

For example, as shown in FIG. 15, the integrated circuit 16 may have six pins. Three of the six pins are electrically connected to cathode electrode pins of the three light-emitting devices 2 in one-to-one correspondence through cathode pads. For the other three pins, one pin may be electrically connected to a data line Data, another pin may be electrically connected to a power supply voltage signal line $V_{CC}$, and yet another pin may be grounded.

In some examples, as shown in FIG. 2, the plurality of light-emitting devices 2 are spaced apart from each other such that there are gaps between the plurality of light-emitting devices 2. The gaps may include a gap between any two adjacent light-emitting devices 2, and a gap between any four adjacent light-emitting devices 2. As shown in FIGS. 3 to 9, the light dimming layer 3 is located in the gaps between the plurality of light-emitting devices 2 and located on surfaces of the plurality of light-emitting devices 2 away from the first base 1, so that at least one light-emitting device 2 is surrounded by the light dimming layer 3.

Here, for the description that the light dimming layer 3 "surrounds" the at least one light-emitting device 2, it means that the light dimming layer 3 is in relatively close contact with side faces of the at least one light-emitting device 2 and surface(s) of the at least one light-emitting device 2 away from the first base 1, so that the light dimming layer 3 completely covers the side faces of the at least one light-emitting device 2 and the surface(s) of the at least one light-emitting device 2 away from the first base 1. In this way, not only may the surface(s) of the at least one light-emitting device 2 be protected to ensure the quality of the at least one light-emitting device 2, but also the at least one light-emitting device 2 may be stably fixed on the first base 1 to prevent the light-emitting device(s) 2 from being loose and difficult to be electrically connected to the first base 1, thereby ensuring a good display effect of the display substrate 100.

In some examples, a material of the light dimming layer 3 includes a light absorbing material, and the light dimming layer 3 is configured to absorb part of light entering the light dimming layer 3.

Here, the light entering the light dimming layer 3 includes light entering the light dimming layer 3 from the outside, and light entering the light dimming layer 3 from the plurality of light-emitting devices 2.

Since an area of a region, onto which the light from the outside is incident, of the light dimming layer 3 is substantially the same as an area of a surface of the light dimming layer 3 away from the first base 1, the light entering the light dimming layer 3 from the outside may basically be completely absorbed by the light dimming layer 3. In this way, in a display process of the display substrate 100, the light dimming layer 3 may reduce an amount of the light that enters the display substrate 100 from the outside and is reflected by the first base 1 and/or the plurality of light-emitting devices 2. As a result, in a case where the display substrate 100 is in a dark state (that is, the light-emitting devices do not emit light), a display surface of the display substrate 100 may be in a darker state, which effectively improves a contrast of the display substrate 100.

In a case where the light emitted by the light-emitting device 2 enters the light dimming layer 3, a portion of the light dimming layer 3, whose material includes the light absorbing material, is able to absorb light, and another portion of the light dimming layer 3, whose material does not include the light absorbing material, may make light pass through smoothly. In this way, since the light emitted by the light-emitting device 2 propagates in arbitrary directions, the light dimming layer 3 absorbs only part of the light emitted by the light-emitting devices 2, and an amount of light that is emitted by the light-emitting device 2 and absorbed by the light dimming layer 3 is reduced, which is beneficial to reduce the power consumption of the display substrate 100.

In some examples, as shown in FIGS. 3 to 9, the second base 4 covers the light dimming layer 3.

For example, the second base 4 may be a PET base. The PET base has a good plasticity and a high transparency, which ensures that the PET base has a good light transmittance, and reduces or avoids loss of light passing through the PET base.

In the examples, the light dimming layer 3 is formed on a side of the second base 4, and then the second base 4 on which the light dimming layer 3 has been formed is pressed on the first base 1 on which the plurality of light-emitting devices 2 have been formed, by using, for example, a pressing process. In this way, compared with the related art, not only may the grinding of the light dimming layer 3 be avoided to make the surface of the light dimming layer 3 away from the first base 1 be a relatively flat surface, but also the second base 4 may also be used to protect the light dimming layer 3 to prevent damage to the surface of the light dimming layer 3 away from the first base 1, and to make a surface of the display substrate 100 have a high uniformity.

Therefore, in the display substrate 100 provided in some embodiments of the present disclosure, the light dimming layer 3 is disposed in the gaps between the plurality of light-emitting devices 2 and on the surfaces of the plurality of light-emitting devices 2 away from the first base 1, and the second base 4 covers the surface of the light dimming layer 3 away from the first base 1. In this way, not only may the light dimming layer 3 protect the plurality of light-emitting devices 2 and the second base 4 protect the light dimming layer 3, but also the light dimming layer 3 may absorb the part of the light entering the light dimming layer 3, which improves the contrast of the display substrate 100 and reduces the power consumption of the display substrate 100. In addition, the second base 4 on which the light dimming layer 3 has been formed is pressed on the first base 1 on which the plurality of light-emitting devices 2 have been formed, by, for example, the pressing process, compared with the related art, the grinding of the light dimming layer 3 may be avoided, a process may be saved, and a surface of the display substrate 100 may have a high uniformity.

In some embodiments of the present disclosure, there are various structures of the light dimming layers 3, and a type of the structure of the light dimming layer 3 in the display substrate 100 may be selectively set according to actual needs. The structure of the light dimming layer 3 is schematically described below.

Figure 4:
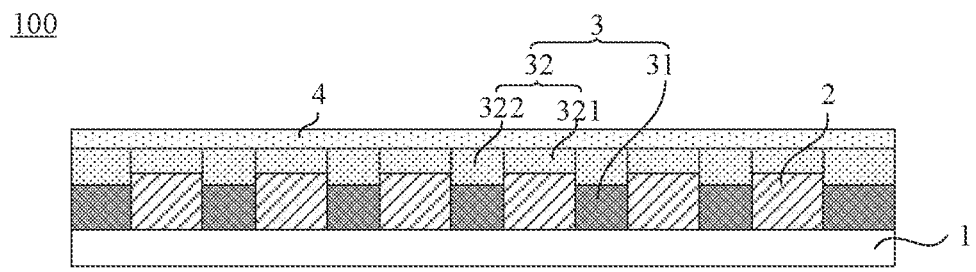
FIG. 4 is another sectional view of the display substrate in FIG. 2 taken along the A-A' line.

In some embodiments, as shown in FIG. 4, the light dimming layer 3 includes a first light dimming sub-layer 31 located in the gaps between the plurality of light-emitting devices 2, and a second light dimming sub-layer 32 disposed on a side of the first light dimming sub-layer 31 away from the first base 1.

In some examples, there are positional relationships between the first light dimming sub-layer 31 and the plurality of light-emitting devices 2, which are related to the structure of the plurality of light-emitting devices 2.

For example, the plurality of light-emitting devices 2 include mini LEDs. The positional relationship between the first light dimming sub-layer 31 and the plurality of light-emitting devices 2 may be that: relative to a surface, on which the plurality of light-emitting devices 2 are arranged, of the first base 1, a surface of the first light dimming sub-layer 31 away from the first base 1 is flush with the surfaces of the plurality of light-emitting devices 2 away from the first base 1; or as shown in FIG. 4, the surface of the first light dimming sub-layer 31 away from the first base 1 is lower than the surfaces of the plurality of light-emitting devices 2 away from the first base 1. In this case, the first light dimming sub-layer 31 is all located in the gaps between the plurality of light-emitting devices 2, and the first light dimming sub-layer 31 covers at least portions of side faces of the plurality of light-emitting devices 2.

Here, since the first light dimming sub-layer 31 is all located in the gaps between the plurality of light-emitting devices 2, a distance between the surface of the first base 1 and the surface of the first light dimming sub-layer 31 away from the first base 1 is a thickness of the first light dimming sub-layer 31. The thickness of the first light dimming sub-layer 31 may be in a range from 80% to 100% of a thickness of the plurality of light-emitting devices 2 (i.e., a dimension of the plurality of light-emitting devices 2 in a thickness direction of the first base 1). For example, the thickness of the plurality of light-emitting devices 2 may be 100 μm, and the thickness of the first light dimming sub-layer 31 may be in a range from 80 μm to 100 μm. For example, the thickness of the plurality of light-emitting devices 2 may be 150 μm, and the thickness of the first light dimming sub-layer 31 may be in a range from 120 μm to 150 μm. The specific thickness of the first light dimming sub-layer 31 may be selectively set according to actual needs.

Figure 20:
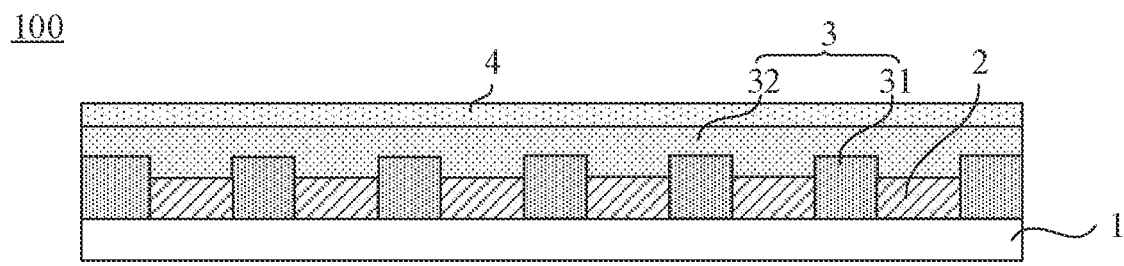
FIG. 20 is yet another sectional view of the display substrate in FIG. 2 taken along the A-A' line.

For example, the plurality of light-emitting devices 2 include mini LEDs or micro LEDs. The positional relationship between the first light dimming sub-layer 31 and the plurality of light-emitting devices 2 may be that: relative to the surface of the first base 1, as shown in FIG. 20, the surface of the first light dimming sub-layer 31 away from the first base 1 is higher than the surfaces of the plurality of light-emitting devices 2 away from the first base 1. In this case, a portion of the first light dimming sub-layer 31 is located in the gaps between the plurality of light-emitting devices 2, and the other portions of the first light dimming sub-layer 31 are located on the surfaces of the plurality of light-emitting devices 2 away from the first base 1; and the first light dimming sub-layer 31 covers exposed surfaces of the plurality of light-emitting devices 2 (including the side faces of the plurality of light-emitting devices 2 and the surfaces of the plurality of light-emitting devices 2 away from the first base 1).

Here, the distance between the surface of the first base 1 and the surface of the first light dimming sub-layer 31 away from the first base 1 may be greater than the thickness of the plurality of light-emitting devices 2 and less than or equal to 120% of the thickness of the plurality of light-emitting devices 2.

For example, the plurality of light-emitting devices 2 include micro LEDs. A thickness of the micro LED is generally relatively small, for example, may be less than 10 μm. Considering a process for fabricating the first light dimming sub-layer 31, in a case where the thickness of the first light dimming sub-layer 31 is relatively small, the thickness of the fabricated first light dimming sub-layer 31 may be approximately 10 μm. In this way, relative to the surface of the first base 1, the surface of the first light dimming sub-layer 31 away from the first base 1 is higher than the surfaces of the plurality of light-emitting devices 2 away from the first base 1. For example, the thickness of the light-emitting device 2 may be 10 μm, and the distance between the surface of the first base 1 and the surface of the first light dimming sub-layer 31 away from the first base 1 may be greater than 10 μm and less than or equal to 12 μm. The specific thickness of the first light dimming sub-layer 31 may be selectively set according to actual needs.

It will be noted that the first light dimming sub-layer 31 also covers portions of the first base 1 exposed by the gaps between the plurality of light-emitting devices 2. In this way, in a case where there is a large adhesive force between the first light dimming sub-layer 31 and the first base 1, the first light dimming sub-layer 31 may be utilized to enhance connection between the plurality of light-emitting devices 2 and the first base 1, so that the plurality of light-emitting devices 2 may be firmly fixed on the first base 1.

In some examples, a material of the first light dimming sub-layer 31 includes the light absorbing material, and the first light dimming sub-layer 31 is configured to absorb at least part of light entering the first light dimming sub-layer 31. In this way, the first light dimming sub-layer 31 may absorb light entering the first light dimming sub-layer 31 from the outside, so as to weaken or even prevent the light from being reflected by the first base 1 and/or the plurality of light-emitting devices 2. As a result, in the case where the display substrate 100 is in the dark state (that is, the light-emitting devices do not emit light), the display surface of the display substrate 100 may be in a darker state, which is beneficial to improve the contrast of the display substrate 100.

In addition, in the case where relative to the surface of the first base 1, the surface of the first light dimming sub-layer 31 away from the first base 1 is higher than the surfaces of the plurality of light-emitting devices 2 away from the first base 1, the distance between the surface of the first base 1 and the surface of the first light dimming sub-layer 31 away from the first base 1 is at most 120% of the thickness of the light-emitting devices 2. In this way, compared with the related art, the thickness of the portions of the first light dimming sub-layer 31 on the surfaces of the plurality of light-emitting devices 2 away from the first base 1 is greatly reduced, which is beneficial to reduce the absorption of the light emitted by the plurality of light-emitting devices 2 by the first light dimming sub-layer 31 and reduce the power consumption of the display substrate 100.

In some other examples, as shown in FIG. 4, relative to the surface of the first base 1, a surface of the second light dimming sub-layer 32 included in the light dimming layer 3 away from the first base 1 is higher than the surfaces of the plurality of light-emitting devices 2 away from the first base 1, and the second light dimming sub-layer 32 is further disposed on the surfaces of the plurality of light-emitting devices 2 away from the first base 1. That is, a portion of the second light dimming sub-layer 32 is located between the plurality of light-emitting devices 2 and the second base 4. In this way, in a case where the light dimming layer 3 and the second base 4 are formed on the first base 1 on which the plurality of light-emitting devices 2 have been formed, by using, for example, the pressing process, the portion of the second light dimming sub-layer 32 located between the plurality of light-emitting devices 2 and the second base 4 may protect the plurality of light-emitting devices 2 to prevent the plurality of light-emitting devices 2 from being damaged during the pressing process.

Here, a thickness of the second light dimming sub-layer 32 is related to the positional relationship between the first light dimming sub-layer 31 and the plurality of light-emitting devices 2.

For example, in a case where relative to the surface of the first base 1, the surface of the first light dimming sub-layer 31 away from the first base 1 is flush with the surfaces of the plurality of light-emitting devices 2 away from the first base 1, or the surface of the first light dimming sub-layer 31 away from the first base 1 is higher than the surfaces of the plurality of light-emitting devices 2 away from the first base 1, a surface of the second light dimming sub-layer 32 proximate to the first base 1 is a relatively flat surface such that a thickness of the second light dimming sub-layer 32 is relatively uniform. The thickness of the second light dimming sub-layer 32 may be selectively set according to actual needs. For example, the thickness of the second light dimming sub-layer 32 may be in a range from 50 μm to 100 μm, or may be in a range from 10 μm to 40 μm.

For example, as shown in FIG. 4, in the case where relative to the surface of the first base 1, the surface of the first light dimming sub-layer 31 away from the first base 1 is lower than the surfaces of the plurality of light-emitting devices 2 away from the first base 1, the surface of the second light dimming sub-layer 32 proximate to the first base 1 is an uneven surface. In this case, the second light dimming sub-layer 32 includes first portions 321 and a second portion 322. Orthogonal projections of the first portions 321 on the first base 1 coincide with orthogonal projections of the plurality of light-emitting devices 2 on the first base 1, and an orthogonal projection of the second portion 322 on the first base 1 coincides with an orthogonal projection of the first light dimming sub-layer 31 on the first base 1. A thickness of the first portions 321 may be in a range from 20 μm to 100 μm. A thickness of the second portion 322 is in a range from 50 μm to 100 μm.

Of course, the thickness of the first portion 321 and the thickness of the second portion 322 may also be in other numerical ranges, which may be selectively set according to actual needs.

In some examples, the second light dimming sub-layer 32 is a transparent film. The transparent film has a relatively high light transmittance (for example, the light transmittance may be greater than or equal to 90%). The light emitted by the plurality of light-emitting devices 2 may pass through the second light dimming sub-layer 32 smoothly to exit to the outside, which is possible to prevent the second light dimming sub-layer 32 from having an adverse effect on the propagation of the light emitted by the plurality of light-emitting devices 2.

In some examples, a refractive index of the second light dimming sub-layer 32 is greater than a refractive index of the second base 4. The refractive index of the second light dimming sub-layer 32 may be approximately 1.5. For example, the refractive index of the second light dimming sub-layer 32 may be 1.49, 1.5, 1.51, or 1.52. The refractive index of the second base 4 may be approximately 1.4. For example, the refractive index of the second base 4 may be 1.39, 1.4, 1.41, or 1.42.

Since a refractive index of the outside atmosphere to light is approximately 1.0, by setting the refractive index of the second light dimming sub-layer 32 and the refractive index of the second base 4 such that the refractive index of the second light dimming sub-layer 32 is greater than the refractive index of the second base 4, the light emitted by the plurality of light-emitting devices 2 may gradually exit from an optically denser medium to an optically rarer medium in a process of exiting to the outside. In this way, it is beneficial to guide exiting of the light emitted by the light-emitting devices 2, weaken or even avoid total reflection compared with a case where the light emitted by the plurality of light-emitting devices 2 directly exists the external atmosphere.

Figure 6:
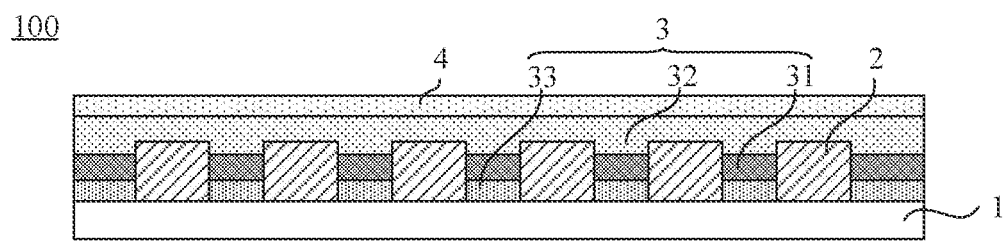
FIG. 6 is yet another sectional view of the display substrate in FIG. 2 taken along the A-A' line.

In some other embodiments, as shown in FIG. 6, on the basis of including the first light dimming sub-layer 31 and the second light dimming sub-layer 32, the light dimming layer 3 further includes a third light dimming sub-layer 33. The third light dimming sub-layer 33 is located in the gaps between the plurality of light-emitting devices 2 and disposed between the first light dimming sub-layer 31 and the first base 1. That is, the third light dimming sub-layer 33, the first light dimming sub-layer 31 and the second light dimming sub-layer 32 are sequentially stacked in the thickness direction of the first base 1.

In some examples, the positional relationship between the third light dimming sub-layer 31 and the plurality of light-emitting devices 2 may be that: relative the surface of to the first base 1, a surface of the third light dimming sub-layer 33 away from the first base 1 is flush with the surfaces of the plurality of light-emitting devices 2 away from the first base 1; or as shown in FIG. 6, the surface of the third light dimming sub-layer 33 away from the first base 1 is lower than the surfaces of the plurality of light-emitting devices 2 away from the first base 1. In this case, the third light dimming sub-layer 33 is all located in the gaps between the plurality of light-emitting devices 2, and the third light dimming sub-layer 33 covers at least portions of the side faces of the plurality of light-emitting devices 2.

In some examples, a material of the third light dimming sub-layer 33 includes a light reflecting material, and the third light dimming sub-layer 33 is configured to reflect light incident from the plurality of light-emitting devices 2 onto the third light dimming sub-layer 332 back into the plurality of light-emitting devices 2. In this way, in a case where the light emitted by the plurality of light-emitting devices 2 is incident onto the side faces of the plurality of light-emitting devices 2 covered by the third light dimming sub-layer 33, the light is reflected at least once due to the third light dimming sub-layer 33. As a result, the reflected light may exit from the surfaces of the plurality of light-emitting devices 2 away from the first base 1 to the outside, which is beneficial to improve a utilization rate of the light emitted by the plurality of light-emitting devices 2, improve the light efficiency of the display substrate 100 and reduce the power consumption of the display substrate 100.

The third light dimming sub-layer 33 only covers the at least portions of the side faces of the plurality of light-emitting devices 2, which may ensure that the light emitted by the plurality of light-emitting devices 2 may exit from the surfaces of the plurality of light-emitting devices 2 away from the first base 1, so as to avoid a situation that the light is reflected back into the plurality of light-emitting devices 2 after being incident onto the surfaces of the plurality of light-emitting devices 2 away from of the first base 1 and is difficult to exit to the outside.

In some examples, a reflectivity of the third light dimming sub-layer 33 is greater than or equal to 70%. In this way, it may be effectively ensured that the third light dimming sub-layer 33 has a good reflection effect on the light emitted by the light-emitting devices 2 being incident onto the third light dimming sub-layer 33, and that the display substrate 100 has a high light efficiency and lower power consumption. For example, the reflectivity of the third light dimming sub-layer 33 may be 70%, 80%, 90%, or 95%.

Here, in the case where the light dimming layer 3 further includes the third light dimming sub-layer 33, the positional relationship between the first light dimming sub-layer 31 and the plurality of light-emitting devices 2 may be that: relative to the surface of the first base 1, the surface of the first light dimming sub-layer 31 away from the first base 1 is flush with the surfaces of the plurality of light-emitting devices 2 away from the first base 1, or the surface of the first light dimming sub-layer 31 away from the first base 1 is higher or lower than the surfaces of the plurality of light-emitting devices 2 away from the first base 1. For example, the distance between the surface of the first base 1 and the surface of the first light dimming sub-layer 31 away from the first base 1 is in a range from 80% to 120% of the thickness of the plurality of light-emitting devices 2. For other descriptions of the first light dimming sub-layer 31 and the second light dimming sub-layer 32, reference may be made to the descriptions of the first light dimming sub-layer 31 and the second light dimming sub-layer 32 in some of the above examples, which will not be repeated here.

Figure 5:
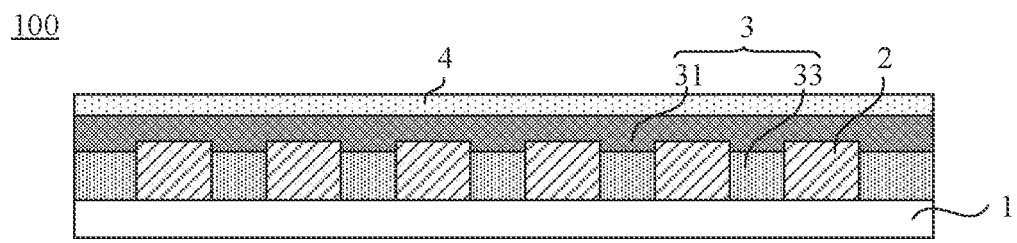
FIG. 5 is yet another sectional view of the display substrate in FIG. 2 taken along the A-A' line.

In yet some other embodiments, as shown in FIG. 5, the light dimming layer 3 may include the third light dimming sub-layer 33 and the first light dimming sub-layer 31. The material of the third light dimming sub-layer 33 includes the light reflecting material, and the third light dimming sub-layer 33 is configured to reflect light incident from the plurality of light-emitting devices 2 onto the third light dimming sub-layer 33 back into the plurality of light-emitting devices 2. The material of the first light dimming sub-layer 31 includes the light absorbing material, and the first light dimming sub-layer 31 is configured to absorb at least part of the light entering the first light dimming sub-layer 31.

In some examples, as shown in FIG. 5, the third light dimming sub-layer 33 is located in the gaps between the plurality of light-emitting devices 2. Relative to the surface of the first base 1, the surface of the third light dimming sub-layer 33 away from the first base 1 is flush with the surfaces of the plurality of light-emitting devices 2 away from the first base 1, or the surface of the third light dimming sub-layer 33 away from the first base 1 is lower than the surfaces of the plurality of light-emitting devices 2 away from the first base 1. In this case, the third light dimming sub-layer 33 is all located in the gaps between the plurality of light-emitting devices 2, and the third light dimming sub-layer 33 covers at least portions of the side faces of the plurality of light-emitting devices 2.

In some examples, as shown in FIG. 5, the first light dimming sub-layer 31 is disposed on a side of the third light dimming sub-layer 33 away from the first base 1 and disposed on the surfaces of the plurality of light-emitting devices 2 away from the first base 1. Relative to the surface of the first base 1, the surface of the first light dimming sub-layer 31 away from the first base 1 is higher than the surfaces of the plurality of light-emitting devices 2 away from the first base 1. That is, regardless of a positional relationship between the surface of the third light dimming sub-layer 33 away from the first base 1 and the surfaces of the plurality of light-emitting devices 2 away from the first base 1, the first light dimming sub-layer 31 covers the plurality of light-emitting devices 2 and the third light dimming sub-layer 33, and portions of the first light dimming sub-layer 31 are located on the surfaces of the plurality of light-emitting devices 2 away from the first base 1, so as to protect the plurality of light-emitting devices 2.

By providing the third light dimming sub-layer 33 and the first light dimming sub-layer 31, due to the cooperation between the third light dimming sub-layer 33 and the first light dimming sub-layer 31, the third light dimming sub-layer 33 may be utilized to improve the utilization rate of the light emitted by the plurality of light-emitting devices 2, improve the light efficiency of the display substrate 100 and reduce the power consumption of the display substrate 100, and the first light dimming sub-layer 31 may be utilized to improve the contrast of the display substrate 100.

In addition, during a process of fabricating the light dimming layer 3, by adjusting the thickness of the first light dimming sub-layer 31, a thickness (for example, the thickness is 10 μm) of the portions of the first light dimming sub-layer 31 located on the surfaces of the plurality of light-emitting devices 2 away from the first base 1 may be adjusted, so as to improve the contrast of the display substrate 100 by utilizing the first light dimming sub-layer 31, and reduce the absorption of the light emitted by the plurality of light-emitting devices 2 by the first light dimming sub-layer 31 to reduce the power consumption of the display substrate 100.

Here, for other descriptions of the third light dimming sub-layer 33 and the first light dimming sub-layer 31, reference may be made to the descriptions of the third light dimming sub-layer 33 and the first light dimming sub-layer 31 in some of the above examples, which will not be repeated here.

In the embodiments, a material of each sub-layer included in the light dimming layer 3 is various.

In some examples, in a case where the light dimming layer 3 includes the first light dimming sub-layer 31, the material of the first light dimming sub-layer 31 includes acrylic adhesive doped with the light absorbing material. For example, the light absorbing material may include carbon black particles.

In some examples, in a case where the light dimming layer 3 includes the second light dimming sub-layer 32, the material of the second light dimming sub-layer 32 includes acrylic adhesive.

In some examples, in a case where the light dimming layer 3 includes the third light dimming sub-layer 33, the material of the third light dimming sub-layer 33 includes acrylic adhesive doped with the light reflecting material. For example, the light reflecting material may include titanium dioxide particles.

The acrylic adhesive has advantages of colorlessness and transparency, high light transmittance (for example, the light transmittance may be greater than or equal to 90%) and good bonding strength. In this way, good adhesion may be provided between sub-layers in the light dimming layer 3, and thus good adhesion may be provided between the light dimming layer 3 and the first base 1, the light dimming layer 3 and the light-emitting devices 2, and the light dimming layer 3 and the second base 4. Therefore, it is possible to prevent the second base 4 or the light dimming layer 3 from falling off while the connection between the light-emitting devices 2 and the first base 1 is enhanced.

Figure 7:
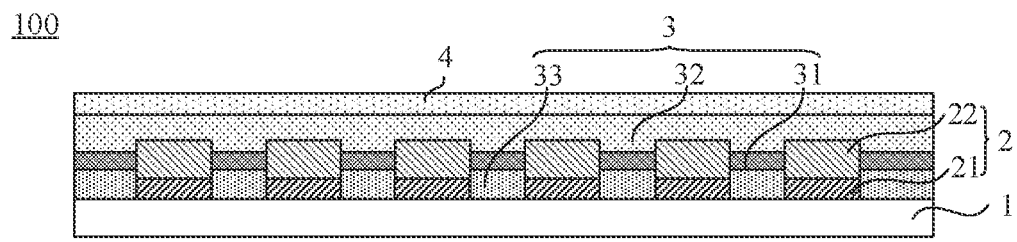
FIG. 7 is yet another sectional view of the display substrate in FIG. 2 taken along the A-A' line.

In some embodiments, as shown in FIG. 7, each light-emitting device 2 of the plurality of light-emitting devices 2 included in the display substrate 100 includes a third base 22 and a light-emitting layer 21 disposed on a side of the third base 22. The light-emitting layer 21 is closer to the first base 1 than the third base 22.

Figure 11:
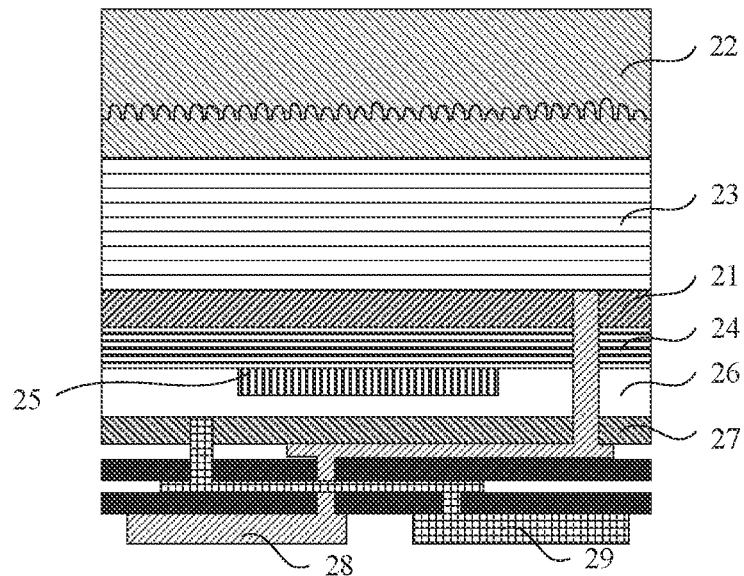
FIG. 11 is a structural diagram of a mini LED, in accordance with some embodiments of the present disclosure.

Hereinafter, as shown in FIG. 11, a structure of the light-emitting device 2 is schematically illustrated by taking an example in which the light-emitting device 2 is the mini LED.

As shown in FIG. 11, the mini LED includes the third base 22, an N-type semiconductor layer 23, the light-emitting layer 21, a P-type semiconductor layer 24, a current blocking layer 25, a conductive layer 26, a Bragg reflective layer 27, and both the cathode electrode pin 28 and the anode electrode pin 29 that are all stacked in sequence. The cathode electrode pin 28 is connected to the N-type semiconductor layer 23, and the anode electrode pin 29 is connected to the conductive layer 26.

In a case where the structure of the mini LED shown in FIG. 11 is applied to the structure of the display substrate 100 shown in FIG. 12, the cathode electrode pin 28 may be connected to the electrode lead 13 through the cathode pad 14, and the anode electrode pin 29 may be connected to the driving transistor 12 through the anode pad 15.

In this embodiment, the light-emitting layer 21 is capable of emitting light, so that light emitted by each light-emitting layer 21 may exit to the outside after passing through the third base 22, the light dimming layer 3 and the second base 4 in sequence.

In some examples, in a case where the light dimming layer 3 includes the second light dimming sub-layer 32, a refractive index of the third base 22 is greater than the refractive index of the second light dimming sub-layer 32, and the refractive index of the second light dimming sub-layer 32 is greater than the refractive index of the second base 4.

Since the refractive index of the second light dimming sub-layer 32 is greater than the refractive index of the second base 4, and the refractive index of the second base 4 is greater than the refractive index of the external atmosphere, by setting the refractive index of the third base 22 to be greater than the refractive index of the second light dimming sub-layer 32, refractive indexes of media that light emitted by the light-emitting layer 21 needs to pass through are gradually reduced according to a certain gradient in a process of the light exiting to the outside. In this way, compared with a case where the light emitted by the light-emitting devices 2 directly exits to the external atmosphere, it is beneficial to guide the exiting of the light emitted by the light-emitting devices 2, weaken or even avoid total reflection, and improve the light-emitting efficiency.

For example, a material of the third base 22 may include a sapphire material, and the refractive index of the third base 22 may be approximately 1.77. For example, the refractive index of the third base 22 may be 1.76, 1.77, or 1.78.

Figure 21:
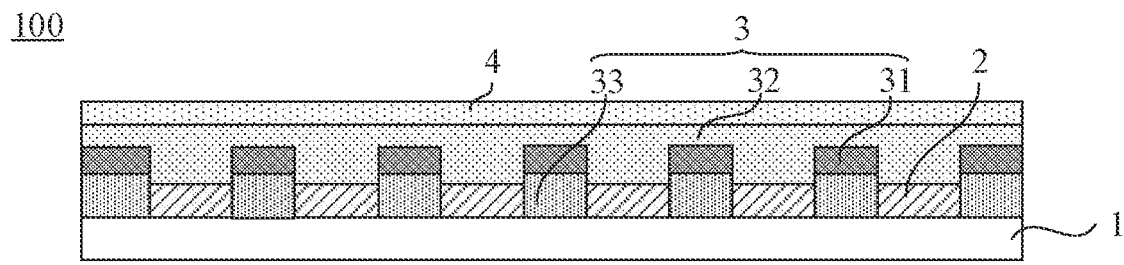
FIG. 21 is yet another sectional view of the display substrate in FIG. 2 taken along the A-A' line.

In some examples, as shown in FIG. 21, in the case where the light dimming layer 3 includes the third light dimming sub-layer 33, a positional relationship between the surface of the third light dimming sub-layer 33 away from the first base 1 and the plurality of light-emitting devices 2 may also be that: relative to the surface of the first base 1, the surface of the third light dimming sub-layer 33 away from the first base 1 is higher than the surfaces of the plurality of light-emitting devices 2 away from the first base 1. In this way, it may be ensured that light emitted by the light-emitting device 2 and incident onto the third light dimming sub-layer 33 is basically reflected back into the light-emitting devices 2 to avoid a phenomenon that the reflected light enters an adjacent light-emitting device 2 to cause color mixing.

In some embodiments, as shown in FIG. 12, the display substrate 100 further includes a reflective layer 5 disposed in gaps between the cathode pads 14 and the anode pads 15, and the reflective layer 5 is located on a side of the plurality of light-emitting devices 2 proximate to the first base 1.

By providing the reflective layer 5 on the side of the plurality of light-emitting devices 2 proximate to the first base 1, the reflective layer 5 may reflect light incident onto the reflective layer 5 back into the plurality of light-emitting devices 2 and then the light exits to the outside through the surfaces of the plurality of light-emitting devices 2 away from the first base 1. In this way, it is beneficial to increase the utilization rate of the light emitted by the plurality of light-emitting devices 2, improve the light efficiency of the display substrate 100, and reduce the power consumption of the display substrate 100.

For example, the reflective layer 5 may be made of white ink with a high reflectivity.

Figure 8:
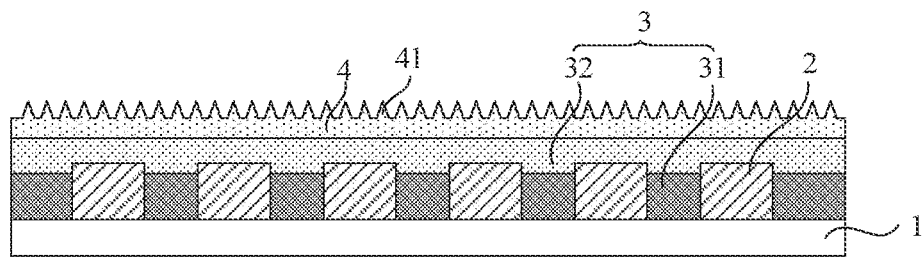
FIG. 8 is yet another sectional view of the display substrate in FIG. 2 taken along the A-A' line.
Figure 9:
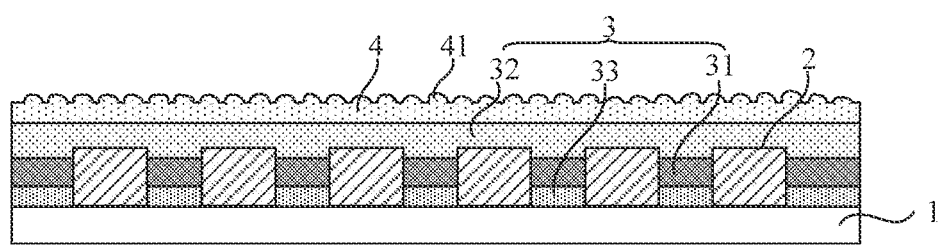
FIG. 9 is yet another sectional view of the display substrate in FIG. 2 taken along the A-A' line.

In some embodiments, a surface of the second base 4 away from the first base 1 may be a flat surface. Of course, as shown in FIGS. 8 and 9, a plurality of microstructures 41 may be provided on the surface of the second base 4 away from the first base 1. The plurality of microstructures 41 are configured to change propagation directions of at least part of light coming from the plurality of light-emitting devices 2 and passing through the second base 4.

Here, a shape of the plurality of microstructures 41 is related to the change of the propagation directions of the at least part of the light passing through the second base 4.

In some examples, as shown in FIG. 8, shapes of surfaces of the plurality of microstructures 41 that are not in contact with the second base 4 include at least one of a pyramid or a wedge. A tip of the pyramid or wedge points to a side of the pyramid or wedge away from the second base 4. In this case, the plurality of microstructures 41 are able to concentrate at least part of the light coming from the light-emitting devices 2 and passing through the second base 4, which is conducive to improving display brightness of the display substrate 100.

Here, dimensions of the microstructure 41 may be selectively set according to actual needs. For example, a height of the microstructure 41 (i.e., a dimension of the microstructure 41 in the thickness direction of the first base 1) may be approximately 12 μm, and a width of the microstructure 41 (i.e., a dimension of a surface of the microstructure 41 that is in contact with the second base 4 in a direction perpendicular to the thickness direction of the first base 1 as shown in FIG. 9) may be approximately 24 μm. For example, the height of the microstructure 41 may be 11 μm, 12 μm, or 13 μm, and the width of the microstructure 41 may be 23 μm, 24 μm, or 25 μm.

In some other examples, as shown in FIG. 9, shapes of surfaces of the plurality of microstructures 41 that are not in contact with the second base 4 include at least one of a curved shape or a spherical shape. In this case, the plurality of microstructures 41 are able to diffuse at least part of the light coming from the plurality of light-emitting devices 2 and passing through the second base 4, thereby improving uniformity of light exiting from the display substrate 100, and avoiding a glare phenomenon on the display surface of the display substrate 100.

Here, dimensions of the microstructure 41 may be selectively set according to actual needs. For example, a diameter of the microstructure 41 (i.e., a dimension of a surface, in contact with the second base 4, of the microstructure 41 in the direction perpendicular to the thickness direction of the first base 1) may be in a range from 20 μm to 30 μm, and a height of the microstructure 41 (i.e., a dimension of the microstructure 41 in the thickness direction of the first base 1) may be approximately 10 μm. For example, the diameter of the microstructure 41 may be 20 μm, 23 μm, 27 μm, or 30 μm, and the height of the microstructure 41 may be 9 μm, 10 μm, or 11 μm.

In some examples, the plurality of microstructures 41 and the second base 4 form a one-piece structure, which is conducive to simplifying the structure of the display substrate 100.

For example, an etching process may be used to etch a surface of a second base 4 to be formed away from the first base 1 to form the plurality of microstructures 41 and the second base 4. Since the second base 4 has a certain hardness, the structure of the plurality of microstructures 41 formed by using the etching process is extremely stable, which may avoid deformation of the plurality of microstructures 41.

In addition, in some embodiments, the display substrate 100 may be applied in a liquid crystal display apparatus as a light source in a backlight module in the liquid crystal display apparatus.

Figure 10:
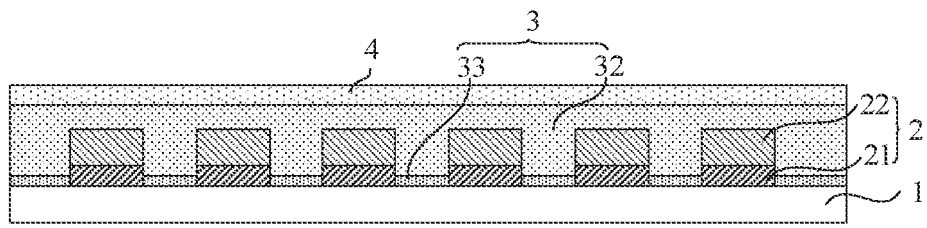
FIG. 10 is yet another sectional view of the display substrate in FIG. 2 taken along the A-A' line.

In this case, as shown in FIG. 10, the light dimming layer 3 may include the third light dimming sub-layer 33 located in the gaps between the plurality of light-emitting devices 2, and the second light dimming sub-layer 32 disposed on the side of the third light dimming sub-layer 33 away from the first base 1. Relative to the surface of the first base 1, the surface of the third light dimming sub-layer 33 away from the first base 1 is lower than surfaces of light-emitting layers 21 in the plurality of light-emitting devices 2 away from the first base 1; the surface of the second light dimming sub-layer 32 away from the first base 1 is higher than the surfaces of the plurality of light-emitting devices 2 away from the first base 1. In this way, the third light dimming sub-layer 33 may comprehensively reflect the light emitted by the plurality of light-emitting devices 2 from various directions, and the second light dimming sub-layer 32 and the second base 4 guide the light to avoid total reflection, thereby effectively increasing luminance displayed by the display substrate 100.

On this basis, the display substrate 100 further includes quantum dot films disposed on a side of the second base 4 away from the first base 1 and located in the plurality of sub-pixel regions. For example, the plurality of light-emitting devices 2 all emit blue light, and after the blue light passes through the quantum dot films in the plurality of sub-pixel regions, the blue light is converted into light with various colors, such as red light or green light.

Figure 16:
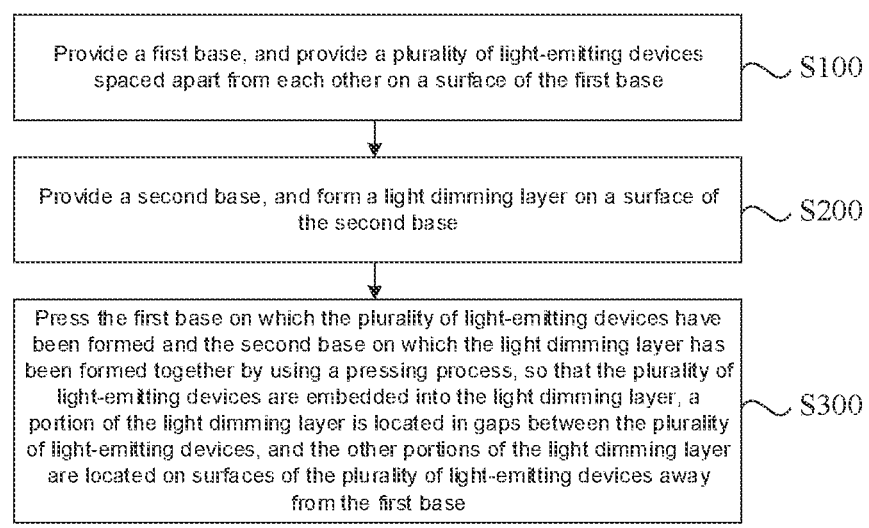
FIG. 16 is a flow diagram of a method for manufacturing a display substrate, in accordance with some embodiments of the present disclosure.

Some embodiments of the present disclosure provide a method for manufacturing a display substrate. As shown in FIG. 16, the method for manufacturing the display substrate includes steps 100 to 300 (S100 to S300).

Figure 17:
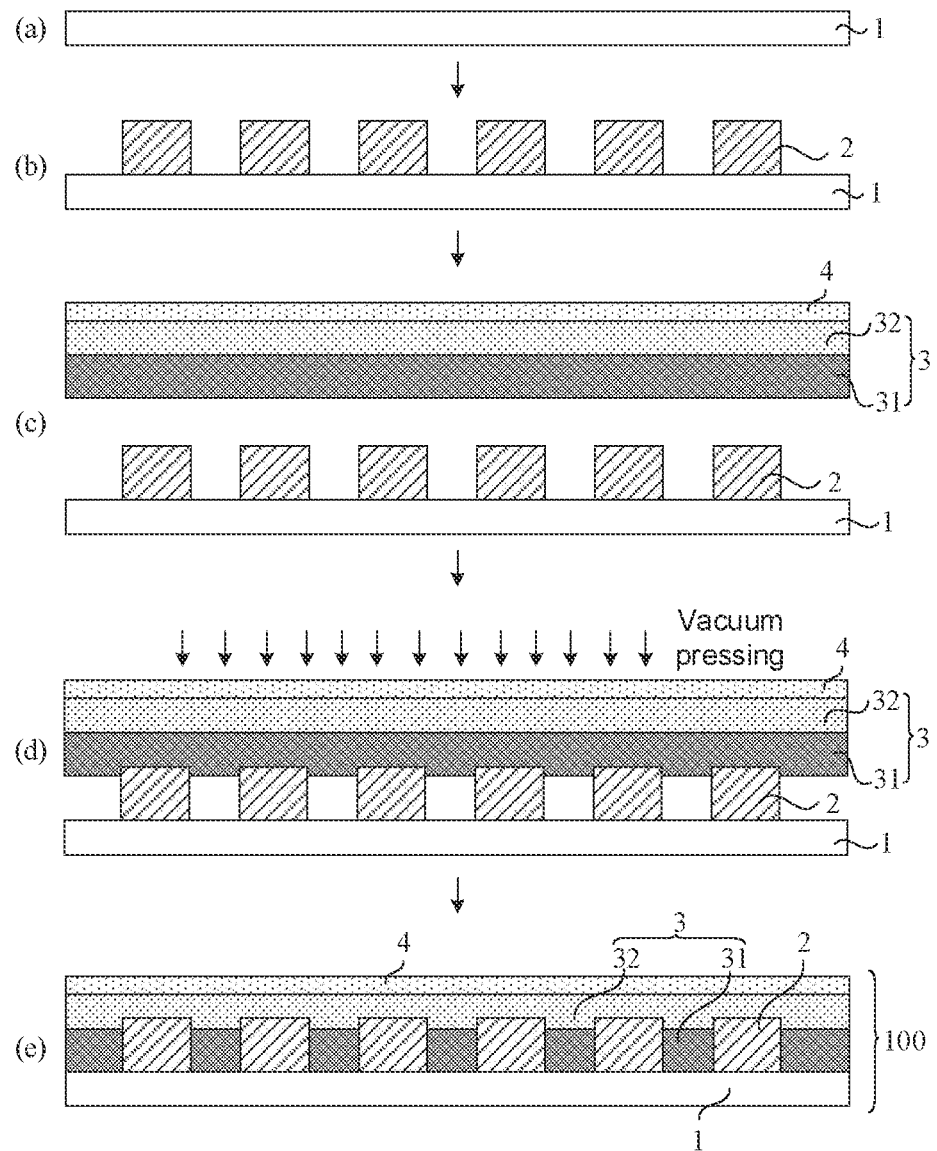
FIG. 17 is a diagram showing steps for manufacturing a display substrate, in accordance with some embodiments of the present disclosure.
Figure 18:
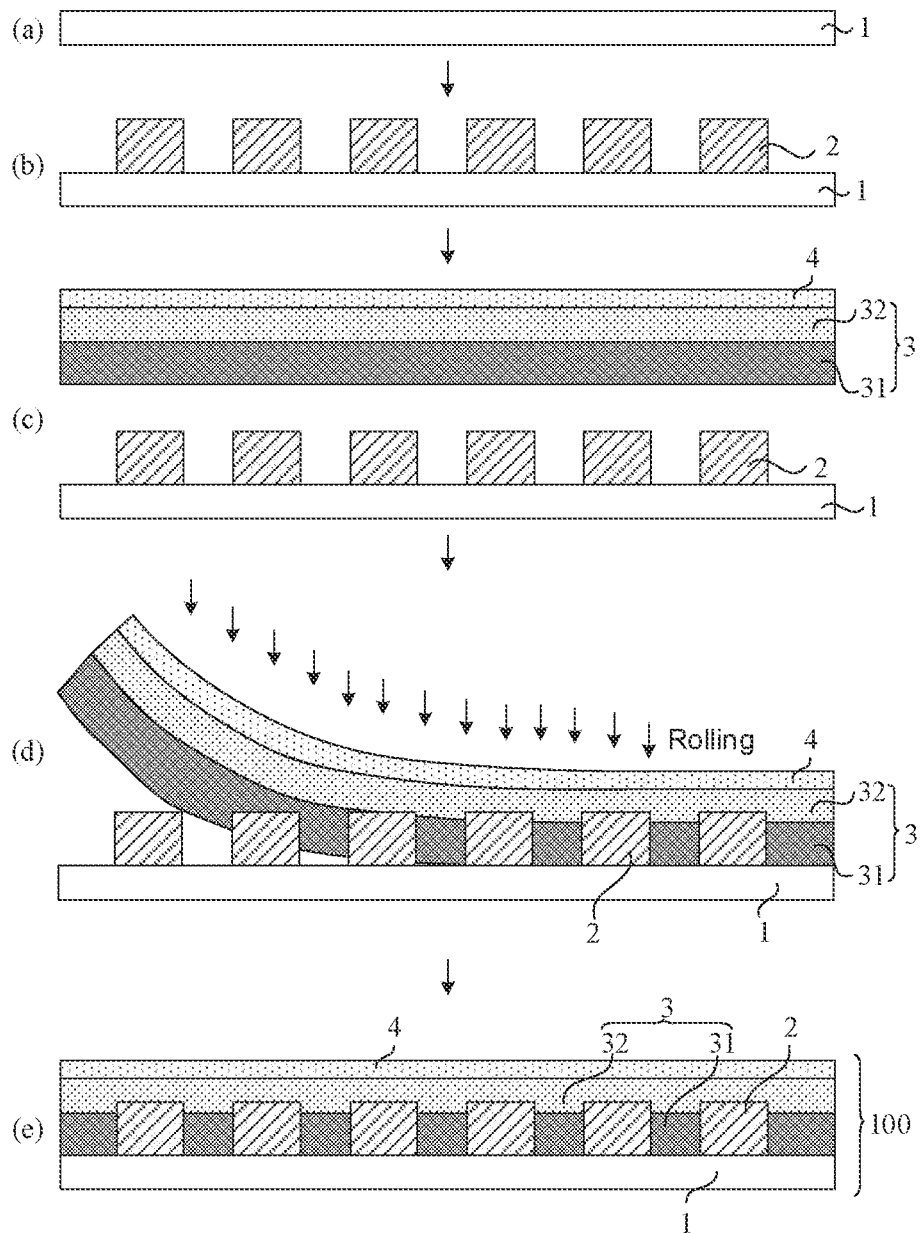
FIG. 18 is a diagram showing steps for manufacturing another display substrate, in accordance with some embodiments of the present disclosure.

In S100, as shown in (a) and (b) of FIG. 17 and (a) and (b) of FIG. 18, a first base 1 is provided, and a plurality of light-emitting devices 2 spaced apart from each other are provided on a surface of the first base 1.

In some examples, the plurality of light-emitting devices 2 may include mini LEDs or micro LEDs. For example, when the plurality of light-emitting devices 2 are provided on the surface of the first base 1, a mass transfer technology may be used to transfer the plurality of light-emitting devices 2 to the surface of the first base 1.

Here, with regard to a structure of the first base 1, a structure of the plurality of light-emitting devices 2 and connection between the first base 1 and the plurality of light-emitting devices 2, reference may be made to the descriptions in the above embodiments, which will not be repeated here.

In S200, as shown in (c) of FIG. 17 and (c) of FIG. 18, a second base 4 is provided, and a light dimming layer 3 is formed on a surface of the second base 4. A material of a portion, located in gaps between the plurality of light-emitting devices 2, of the light dimming layer 3 includes a light absorbing material.

For example, the second base 4 may be a PET base. That is, the second base 4 may be a thin film made of PET.

In some examples, forming the light dimming layer 3 on the surface of the second base 4 includes: coating materials for forming the light dimming layer 3 on the surface of the second base 4, and curing the materials for forming the light dimming layer 3, so as to form the light dimming layer 3.

In some examples, as shown in (c) of FIG. 17 and (c) of FIG. 18, the light dimming layer 3 includes a first light dimming sub-layer 31 and a second light dimming sub-layer 32 that are arranged in a stack.

In this case, forming the light dimming layer 3 on the surface of the second base 4, for example, may include: coating a material for forming the second light dimming sub-layer 32 on the surface of the second base 4, and curing the material for forming the second light dimming sub-layer 32, so as to form the second light dimming sub-layer 32; coating a material for forming the first light dimming sub-layer 31 on another thin film (e.g., a release film), and curing the material for forming the first light dimming sub-layer 31, so as to form the first light dimming sub-layer 31; afterwards, attaching the first light dimming sub-layer 31 to the second light dimming sub-layer 32, and removing the another thin film attached to a side of the first light dimming sub-layer 31, so as to obtain the light dimming layer 3 formed on the surface of the second base 4.

In S300, as shown in (d) and (e) of FIG. 17 and (d) and (e) of FIG. 18, the first base 1 on which the plurality of light-emitting devices 2 have been formed and the second base 4 on which the light dimming layer 3 has been formed are pressed together by using a pressing process, so that the plurality of light-emitting devices 2 are embedded into the light dimming layer 3, the portion of the light dimming layer 3 is located in the gaps between the plurality of light-emitting devices 2, and the other portions of the light dimming layer 3 are located on surfaces of the plurality of light-emitting devices 2 away from the first base 1.

In some examples, in addition to the light absorbing material, a material of the light dimming layer 3 further includes acrylic adhesive.

Since acrylic adhesive has an advantage of being cured at room temperature or medium temperature, when the light dimming layer 3 is formed on the surface of the second base 4 in the S200, the material for forming the light dimming layer 3 may be cured at room temperature or medium temperature. In this way, an additional curing operation may be avoided, which is conducive to simplifying a manufacturing process of the display substrate 100, thereby saving the cost for manufacturing the display substrate 100.

Since the acrylic adhesive has a certain elasticity and is capable of filling gap(s), in a process of pressing the first base 1 on which the plurality of light-emitting devices 2 have been formed and the second base 4 on which the light dimming layer 3 has been formed together, the plurality of light-emitting devices 2 may gradually enter the light dimming layer 3 until the plurality of light-emitting devices 2 are completely embedded into the light dimming layer 3. The portion of the light dimming layer 3 is able to fill the gaps between the plurality of light-emitting devices 2 until the gaps between the plurality of light-emitting devices 2 are filled up.

The other portions of the light dimming layer 3 are located on the surfaces of the plurality of light-emitting devices 2 away from the first base 1, i.e., located between the plurality of light-emitting devices 2 and the second base 4. In this way, the other portions of the light dimming layer 3 may protect the plurality of light-emitting devices 2, so as to prevent the second base 4 from being in direct contact with the plurality of light-emitting devices 2 to cause damage to the light-emitting devices 2.

In the method for manufacturing the display substrate 100 provided in the embodiments of the present disclosure, by forming the light dimming layer 3 on the surface of the second base 4, and then pressing the first base 1 on which the plurality of light-emitting devices 2 have been formed and the second base 4 on which the light dimming layer 3 has been formed together by using the pressing process, the plurality of light-emitting devices 2 are embedded into the light dimming layer 3, the portion of the light dimming layer 3 is located in the gaps between the plurality of light-emitting devices 2, and the other portions of the light dimming layer 3 are located on the surfaces of the plurality of light-emitting devices 2 away from the first base 1. The light dimming layer 3 may absorb part of the light incident onto the light dimming layer 3, which improves the contrast of the display substrate 100 without increasing the power consumption of the display substrate 100. Moreover, compared with the related art, the method for manufacturing the display substrate 100 provided in the embodiments of the present disclosure is simple in process and easy to operate, which avoids the grinding of the light dimming layer 3, thereby avoiding whitening of the surface of the display substrate 100, and making the surface of the display substrate 100 have a high uniformity.

In some embodiments, there are various types of the pressing process.

For example, the pressing process may include a vacuum pressing process.

As shown in (d) of FIG. 17, in a process of pressing the first base 1 on which the plurality of light-emitting devices 2 have been formed and the second base 4 on which the light dimming layer 3 has been formed together by using the vacuum pressing process, the second base 4 on which the light dimming layer 3 has been formed may be entirely pressed on the first base 1 on which the plurality of light-emitting devices 2 have been formed while a vacuum pumping operation is performed. In this way, the surface of the light dimming layer 3 proximate to the plurality of light-emitting devices 2 may be in contact with the plurality of light-emitting devices 2 substantially at the same time, so that the plurality of light-emitting devices 2 may be embedded into the light dimming layer 3 substantially at the same time. In addition, a formation of bubbles between the light dimming layer 3 and the first base 1 is also avoided.

For example, the pressing process may include a rolling process.

As shown in (d) of FIG. 18, in a process of pressing the first base 1 on which the plurality of light-emitting devices 2 have been formed and the second base 4 on which the light dimming layer 3 has been formed together by using the rolling process, an end (e.g., the right end shown in FIG. 18) of the first base 1 on which the plurality of light-emitting devices 2 have been formed may be pressed first together with an end (e.g., the right end shown in FIG. 18) of the second base 4 on which the light dimming layer 3 has been formed, so that light-emitting device(s) 2 at this end are completely embedded into the light dimming layer 3; then, a pressing position is gradually moved to an opposite end (e.g., the left end shown in FIG. 18) of the first base 1, so that the plurality of light-emitting devices 2 are sequentially embedded into the light dimming layer 3 from the end to the opposite end of the first base 1; and afterwards a heating-up deaerating process is performed. In this way, the bubbles that may occur between the light dimming layer 3 and the first base 1 may be reduced or even eliminated.

In some embodiments, in a case where the light dimming layer 3 includes sub-layers, a hardness of a sub-layer proximate to the plurality of light-emitting devices 2 is less than a hardness of another sub-layer away from the plurality of light-emitting devices 2.

For example, the light dimming layer 3 includes the first light dimming sub-layer 31 and the second light dimming sub-layer 32 that are stacked. In this case, a hardness of the first light dimming sub-layer 31 is less than a hardness of the second light dimming sub-layer 32. In this way, in the process of pressing the first base 1 on which the plurality of light-emitting devices 2 have been formed and the second base 4 on which the light dimming layer 3 has been formed together, it is easy for the plurality of light-emitting devices 2 to enter and be embedded into the first light dimming sub-layer 31. In a case where relative to the surface of the first base 1, the surface of the first light dimming sub-layer 31 away from the first base 1 is lower than the surfaces of the plurality of light-emitting devices 2 away from the first base 1, it is possible to slow down and easily control a speed at which the plurality of light-emitting devices 2 enter the second light dimming sub-layer 32, so as to avoid a situation that the plurality of light-emitting devices 2 penetrate through the second light dimming sub-layer 32 to be in contact with the second base 2, thereby advantageously avoiding a situation that the plurality of light-emitting devices 2 are damaged.

In addition, in some embodiments of the present disclosure, the speed at which the plurality of light-emitting devices 2 enter the light dimming layer 3 may also be controlled by controlling a thickness of the second light dimming sub-layer 32.

Figure 19:
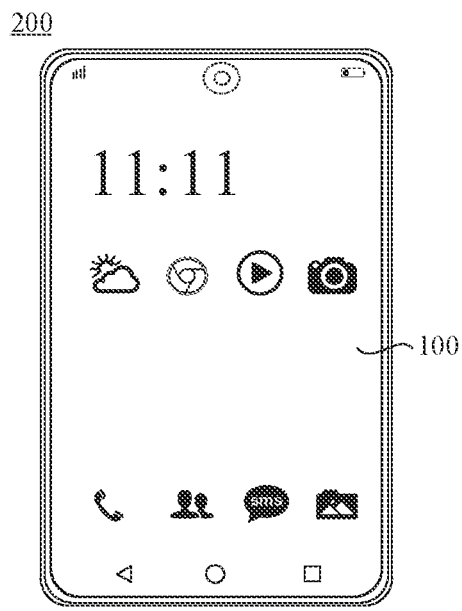
FIG. 19 is a structural diagram of a display apparatus, in accordance with some embodiments of the present disclosure.

Some embodiments of the present disclosure provide a display apparatus 200. As shown in FIG. 19, the display apparatus 200 includes the display substrate 100 provided in some embodiments described above.

The display substrate 100 included in the display apparatus 200 has the same structure and beneficial effects as the display substrate 100 provided in the above embodiments, and details will not be repeated here.

In some examples, the display apparatus 200 further includes a housing for carrying the display substrate 100 and/or a camera mounted on the display substrate 100.

In some embodiments, the display apparatus 200 is any product or component having a display function, such as an electronic paper, a mobile phone, a tablet computer, a television, a display, a notebook computer, a digital photo frame and a navigator.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
   a first base;
   a plurality of light-emitting devices disposed on a side of the first base, the plurality of light-emitting devices being spaced apart from each other;
   a light dimming layer located in gaps between the plurality of light-emitting devices and located on surfaces of the plurality of light-emitting devices furthest away from the first base, at least one light-emitting device being surrounded by the light dimming layer; a material of a portion, located in the gaps between the plurality of light-emitting devices, of the light dimming layer including a light absorbing material, and the light dimming layer being configured to absorb part of light entering the light dimming layer; and
   a second base covering the light dimming layer;
   wherein the light dimming layer includes:
   a first light dimming sub-layer located in the gaps between the plurality of light-emitting devices, wherein relative to a surface, on which the plurality of light-emitting devices are arranged, of the first base, a surface of the first light dimming sub-layer furthest away from the first base is higher or lower than the surfaces of the plurality of light-emitting devices furthest away from the first base; a material of the first light dimming sub-layer includes the light absorbing material, and the first light dimming sub-layer is configured to absorb at least part of light entering the first light dimming sub-layer; and a second light dimming sub-layer disposed on a side of the first light dimming sub-layer furthest away from the first base and disposed on the surfaces of the plurality of light-emitting devices furthest away from the first base, wherein relative to the surface of the first base, a surface of the second light dimming sub-layer furthest away from the first base is higher than the surfaces of the plurality of light-emitting devices furthest away from the first base; and the second light dimming sub-layer is a transparent film.

2. The display substrate according to claim 1, wherein relative to the surface of the first base, the surface of the first light dimming sub-layer furthest away from the first base is lower than the surfaces of the plurality of light-emitting devices furthest away from the first base; and the second light dimming sub-layer includes first portions and a second portion; orthogonal projections of the first portions on the first base coincide with orthogonal projections of the plurality of light-emitting devices on the first base, and an orthogonal projection of the second portion on the first base coincides with an orthogonal projection of the first light dimming sub-layer on the first base; and a thickness of the first portions is in a range from 20 μm to 100 μm, and a thickness of the second portion is in a range from 50 μm to 100 μm.

3. The display substrate according to claim 1, wherein a refractive index of the second light dimming sub-layer is greater than a refractive index of the second base.

4. The display substrate according to claim 1, wherein a distance between the surface of the first base and the surface of the first light dimming sub-layer furthest away from the first base is in a range from 80% to 120%, excluding 100%, of a thickness of the plurality of light-emitting devices.

5. The display substrate according to claim 1, wherein the light dimming layer further includes a third light dimming sub-layer located in the gaps between the plurality of light-emitting devices and disposed between the first light dimming sub-layer and the first base, wherein relative to the surface of the first base, a surface of the third light dimming sub-layer furthest away from the first base is flush with or lower than the surfaces of the plurality of light-emitting devices furthest away from the first base; and a material of the third light dimming sub-layer includes a light reflecting material, and the third light dimming sub-layer is configured to reflect light incident from the plurality of light-emitting devices onto the third light dimming sub-layer back into the plurality of light-emitting devices.

6. The display substrate according to claim 5, wherein a reflectivity of the third light dimming sub-layer is greater than or equal to 70%.

7. The display substrate according to claim 5, wherein the material of the first light dimming sub-layer includes acrylic adhesive doped with the light absorbing material;

a material of the second light dimming sub-layer includes acrylic adhesive; and a material of the third light dimming sub-layer includes acrylic adhesive doped with a light reflecting material.

8. The display substrate according to claim 1, wherein each light-emitting device includes:

a third base; and a light-emitting layer disposed on a side of the third base, the light-emitting layer being closer to the first base than the third base.

9. The display substrate according to claim 8, wherein a refractive index of the third base is greater than a refractive index of the second light dimming sub-layer, and the refractive index of the second light dimming sub-layer is greater than a refractive index of the second base.

10. The display substrate according to claim 8, wherein the light dimming layer further includes a third light dimming sub-layer located in the gaps between the plurality of light-emitting devices and disposed between the first light dimming sub-layer and the first base;

a material of the third light dimming sub-layer includes a light reflecting material, and the third light dimming sub-layer is configured to reflect light incident from the plurality of light-emitting devices onto the third light dimming sub-layer back into the plurality of light-emitting devices; and relative to the surface of the first base, a surface of the third light dimming sub-layer furthest away from the first base is higher than the surfaces of the plurality of light-emitting devices furthest away from the first base.

11. The display substrate according to claim 1, wherein the material of the first light dimming sub-layer includes acrylic adhesive doped with the light absorbing material; and a material of the second light dimming sub-layer includes acrylic adhesive.

12. The display substrate according to claim 1, further comprising a plurality of microstructures disposed on a surface of the second base furthest away from the first base, wherein the plurality of microstructures are configured to change propagation directions of at least part of light coming from the plurality of light-emitting devices and passing through the second base.

13. The display substrate according to claim 12, wherein shapes of surfaces of the plurality of microstructures that are not in contact with the second base include at least one of a pyramid, a wedge, a curved shape or a spherical shape.

14. A display substrate comprising:

a first base;

a plurality of light-emitting devices disposed on a side of the first base, the plurality of light-emitting devices being spaced apart from each other;

a light dimming layer located in gaps between the plurality of light-emitting devices and located on surfaces of the plurality of light-emitting devices furthest away from the first base, at least one light-emitting device being surrounded by the light dimming layer; a material of a portion, located in the gaps between the plurality of light-emitting devices, of the light dimming layer including a light absorbing material, and the light dimming layer being configured to absorb part of light entering the light dimming layer; and a second base covering the light dimming layer, wherein the light dimming layer includes:

a third light dimming sub-layer located in the gaps between the plurality of light-emitting devices, wherein relative to a surface, on which the plurality of light-emitting devices are arranged, of the first base, a surface of the third light dimming sub-layer furthest away from the first base is flush with or lower than the surfaces of the plurality of light-emitting devices furthest away from the first base; a material of the third light dimming sub-layer includes a light reflecting material, and the third light dimming sub-layer is configured to reflect light incident from the plurality of light-emitting devices onto the third light dimming sub-layer back into the plurality of light-emitting devices; and a first light dimming sub-layer disposed on a side of the third light dimming sub-layer furthest away from the first base and disposed on the surfaces of the plurality of light-emitting devices furthest away from the first base, wherein relative to the surface of the first base, a surface of the first light dimming sub-layer furthest away from the first base is higher than the surfaces of the plurality of light-emitting devices furthest away from the first base; a material of the first light dimming sub-layer includes the light absorbing material, and the first light dimming sub-layer is configured to absorb at least part of light entering the first light dimming sub-layer.

15. The display substrate according to claim 14, wherein the material of the first light dimming sub-layer includes acrylic adhesive doped with the light absorbing material; and a material of the third light dimming sub-layer includes acrylic adhesive doped with a light reflecting material.

16. The display substrate according to claim 14, wherein a reflectivity of the third light dimming sub-layer is greater than or equal to 70%.

17. A method for manufacturing a display substrate, the method comprising:
providing a first base;
providing a plurality of light-emitting devices spaced apart from each other on a surface of the first base;
providing a second base;
forming a light dimming layer on a surface of the second base; and
pressing the first base on which the plurality of light-emitting devices have been formed and the second base on which the light dimming layer has been formed together by using a pressing process, so that the plurality of light-emitting devices are embedded into the light dimming layer, a portion of the light dimming layer is located in gaps between the plurality of light-emitting devices, and other portions of the light dimming layer are located on surfaces of the plurality of light-emitting devices furthest away from the first base, wherein a material of the portion, located in the gaps between the plurality of light-emitting devices, of the light dimming layer includes a light absorbing material;

wherein forming the light dimming layer on the surface of the second base includes:

coating a material for forming the second light dimming sub-layer on the surface of the second base, and curing the material for forming the second light dimming sub-layer, so as to form the second light dimming sub-layer;

coating a material for forming the first light dimming sub-layer on another thin film, and curing the material for forming the first light dimming sub-layer, so as to form the first light dimming sub-layer;

attaching the first light dimming sub-layer to the second light dimming sub-layer, and removing the another thin film attached to a side of the first light dimming sub-layer, so as to obtain the light dimming layer formed on the surface of the second base;

relative to a surface, on which the plurality of light-emitting devices are arranged, of the first base, a surface of the first light dimming sub-layer furthest away from the first base is higher or lower than the surfaces of the plurality of light-emitting devices furthest away from the first base.

18. The method for manufacturing the display substrate according to claim 17, wherein the pressing process includes a vacuum pressing process or a rolling process.

19. A display apparatus, comprising the display substrate according to claim 1.

* * * * *